(12) United States Patent
Gerrish

(10) Patent No.: US 6,708,123 B2
(45) Date of Patent: Mar. 16, 2004

(54) VOLTAGE CURRENT SENSOR WITH HIGH MATCHING DIRECTIVITY

(75) Inventor: Kevin S. Gerrish, Rochester, NY (US)

(73) Assignee: ENI Technology Inc., Rochester, NY (US)

(*) Notice: Subject to any disclaimer, the term of this patent is extended or adjusted under 35 U.S.C. 154(b) by 0 days.

(21) Appl. No.: 10/194,688

(22) Filed: Jul. 12, 2002

(65) Prior Publication Data
US 2003/0046013 A1 Mar. 6, 2003

Related U.S. Application Data

(62) Division of application No. 09/031,879, filed on Feb. 27, 1998, now Pat. No. 6,449,568.

(51) Int. Cl.[7] .............................................. G01R 27/00
(52) U.S. Cl. ............................ 702/60; 702/64; 324/95
(58) Field of Search ........................... 702/60, 57, 64, 702/65, 117, 118, 124, FOR 103, FOR 104, FOR 106, FOR 170, FOR 171; 324/95, 754, 755, 759, 72.5, 126, 117 R, 658, 686, 690; 315/111.21, 111.31, 111.41, 111.51, 111.71; 333/17.3, 17.1, 32, 99 PL

(56) References Cited

U.S. PATENT DOCUMENTS

| | | | | |
|---|---|---|---|---|
| 5,770,922 A | * | 6/1998 | Gerrish et al. ........... 315/111.21 |
| 5,808,415 A | * | 9/1998 | Hopkins ................. 315/111.21 |
| 5,834,931 A | * | 11/1998 | Moore et al. .................. 324/95 |
| 5,867,020 A | * | 2/1999 | Moore et al. .................. 324/95 |
| 6,239,587 B1 | * | 5/2001 | Buck ............................ 324/95 |
| 6,449,568 B1 | * | 9/2002 | Gerrish ........................ 702/60 |

* cited by examiner

Primary Examiner—Hal Wachsman
(74) Attorney, Agent, or Firm—Bryan Cave LLP

(57) ABSTRACT

A technique for measuring the current, voltage and phase of a radio frequency (RF) power wave to an RF load, accounts for the finite length of the voltage and current pickups, and corrects for effects of standing wave components of voltage and current. Voltage and current are computed as complex functions of the voltage pickup signal and the current pickup signal, based on coefficients precalibrated for radio frequency. Alternatively, a corrected current value can be based on the corrected voltage value and complex load impedance. The correction coefficients can be obtained, for each of a plurality of calibrating radio frequencies within an RF range, from voltage and current pickup signals under conditions of (a) open circuit load, (b) short circuit load, (c) fixed known impedance load; and (d) one of voltage and current being applied at a precise input level to a know load from an RF calibration source.

5 Claims, 7 Drawing Sheets

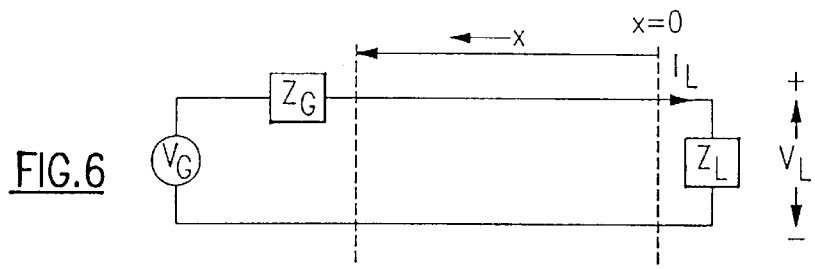
FIG.6
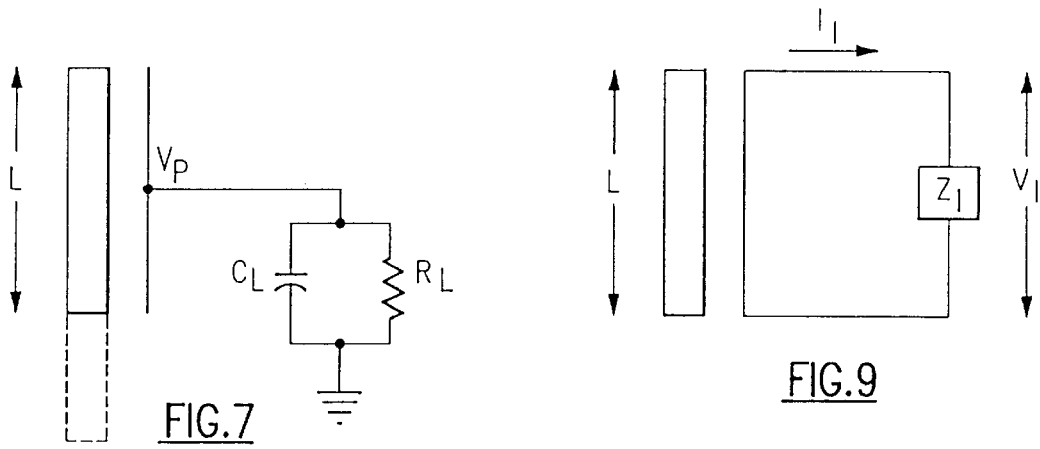
FIG.7
FIG.9
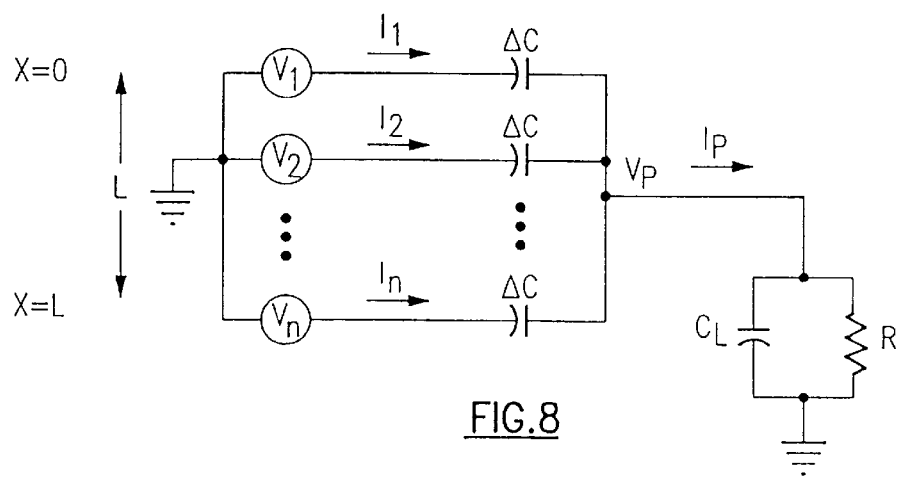
FIG.8

VOLTAGE CURRENT SENSOR WITH HIGH MATCHING DIRECTIVITY

This application is a divisional application of U.S. application Ser. No. 09/031,879 filed on Feb. 27, 1998, now U.S. Pat. No. 6,449,568.

BACKGROUND OF THE INVENTION

This invention relates to accurate measurement of voltage, current and phase of RF power applied to a non-linear load, and is particularly directed to probes for detecting the current, voltage, and phase of radio frequency (RF) electrical power that is being supplied to an RF plasma chamber.

In a typical RF plasma generator arrangement, a high power RF source produces an RF wave at a preset frequency, i.e., 13.56 MHz, and this is furnished along a power conduit to a plasma chamber. Because there is typically a severe impedance mismatch between the RF power source and the plasma chamber, an impedance matching network is interposed between the two. There are non-linearities in the plasma chamber, and because of these and because of losses in the line and in the impedance matching network, not all of the output power of the RF generator reaches the plasma chamber. Therefore, it is conventional to employ a probe in close proximity to the power input to the plasma chamber to detect the voltage and current of the RF wave as it enters the plasma chamber. By accurately measuring the voltage and current as close to the chamber as possible, the user of the plasma process can obtain a better indication of the quality of the plasma. This in turn yields better control of the etching or deposition characteristics for a silicon wafer or other workpiece in the chamber.

At present, diode detection probes are often employed to detect the amplitude of the current and voltage waveforms. These probes simply employ diode detector circuits to rectify the voltage and current waveforms, and deliver simple DC metering outputs for voltage and for current. These probes have at least two drawbacks in this role. Diode detectors are inherently non-linear for low-signal levels, and are notorious for temperature drift. The diode detector circuits also are limited to detecting the signal peaks for the fundamental frequency only, and cannot yield any information about higher or lower frequencies present in the RF power waveform. In addition to this, it is impossible to obtain phase angle information between the current and voltage waveforms, which renders the power measurement less accurate.

One proposal that has been considered to improve the detection of RF power has been to obtain digital samples of the voltage and current outputs of a probe, using flash conversion, and then to process the samples on a high-speed buffer RAM. However, this proposal does have problems with accuracy and precision. At the present time, flash conversion has a low dynamic range, normally being limited to eight bits of resolution. To gain reasonable phase accuracy for plasma customer requirements, it is necessary to reach a precision of at least twelve bits, so that a phase angle precision of better than one degree can be obtained at full power. In addition, flash converters require an extremely fast RAM in order to buffer a block of samples before they are processed in a digital signal processor (DSP), and fast RAM circuitry is both space-consuming and expensive.

Voltage and current probes that are now in existence are limited in their performance by the fact that they can only monitor the voltage, current, and phase angle at one frequency, and even then such probes have a poor dynamic range. Examining behavior at a different frequency requires changing out the hardware, which can be costly and time consuming. This means also that good performance will ensue only if the load is linear, which is never the case with a plasma chamber. Unlike capacitors, inductors, and resistors, plasma chambers impose a highly non-linear load, which causes the sinusoidal waveform of the input power to become distorted. This distortion causes the resulting waveform to be a sum of sinusoids, with the frequency of each additional sinusoid being some integer multiple of the input sinusoidal frequency (i.e., harmonics). Conventional probes can provide voltage, current and coarse phase information, at best, for the fundamental voltage and current waveforms. This severely limits the accuracy of the system, and makes accurate and repeatable control impossible when there is a significant amount of voltage or current appearing in the harmonics.

A possible solution to this has been proposed in U.S. patent application Ser. No. 08/684,833, now U.S. Pat. No. 4,770,922, and having the same assignee as the present patent application. In that case, the voltage/current probe employs a frequency shifting arrangement that converts the sampled voltage and current to a lower frequency baseband signal to facilitate accurate detection of RF current and voltage of the applied power, as well as phase information, with the baseband being approximately 0.2 KHz to 15 KHz. The baseband voltage and current signals are digitized and processed to obtain voltage and current information, and using complex fast fourier transform technique, to obtain accurate phase information. That application Ser. No. 08/684,833 is incorporated herein by reference.

Even with this technique, it remains to provide a super-high matching directivity voltage and current sensor that behaves as if it has a zero probe length, and which accurately reports the voltage, current, and phase conditions at the RF load. The problem in doing this arises because any real voltage probe and any real current probe will have a finite length, and the current and voltage waveforms are not flat over the length of the sensor.

A voltage-current probe, or V/I probe, is a sensor that is intended to produce output signals that represent a zero-length point at which it is inserted. On the other hand, any realistic sensor must be of a finite size to sense the voltage or current. The V/I probe produces a low-level signal which has a well-defined relationship with respect to the high-level signal (i.e., applied current or applied voltage) that is being measured. The fact that the probe or sensor has finite length, coupled with the fact that the applied power and the real-world non-ideal load produce standing waves, means that the RF voltage (or current) is not going to be identical everywhere along its finite length. It is also the case that the effect of non-uniformity over the length of the sensor increases at higher frequencies, e.g., harmonics of the applied RF power. Unfortunately, nothing in the current state of the art compensates for this, and a calibration algorithm for the V/I probe is heretofore unknown in the art.

OBJECTS AND SUMMARY OF THE INVENTION

It is an objective of this invention to provide a reliable and accurate probe, at low cost, for detecting the current and voltage of RF power being applied to a plasma chamber and for accurately finding the load impedance (which may have real and imaginary components) as well as phase angle between the voltage and current applied to the load.

It is a more specific object of this invention to provide an improved voltage and current pickup head that accurately measures the RF voltage and current at the point of injection of an RF power wave into an RF load.

It is a further object to provide a V/I probe with a calibration algorithm to compensate for the non-zero length of the voltage and current sensors of the probe.

According to an aspect of the invention, RF voltage and current levels and relative phase information for current and voltage can be derived for an RF power wave that is applied at a predetermined RF frequency to a load, such as the power input of a plasma chamber. The V/I probe produces a voltage pickup value $V_V$ and a current pickup value $V_I$. However, because the sensors for voltage and current are of finite length, and are not simply points, the technique of this invention compensates to produce corrected values of voltage, current, as well as impedance and phase. This involves computing the voltage as a complex function of the voltage pickup signal and the current pickup signal, based on coefficients precalibrated for the particular operating radio frequency, and also computing the current as a complex function of the voltage and current pickup signals based on coefficients pre-calibrated for that operating radio frequency. This can also be carried out by computing a corrected voltage value as a complex function of the voltage pickup signal and the current pickup signal, based on coefficients precalibrated for the operating radio frequency, computing a complex impedance of the load at the operating radio frequency on the basis of the voltage and current pickup signals, and then computing a corrected current value based on the corrected voltage value and the complex impedance. By "complex impedance" it should be understood that the load impedance may have both a "real" or resistive component and an "imaginary" or reactive (either capacitive or inductive) component.

The signal processor is calibrated with correction factors for each of a number of frequencies within a range. These values are acquired by obtaining voltage and current pickup signals, for each of a number of calibrating radio frequencies within the range, under conditions of (a) open circuit load, (b) short circuit load, (c) fixed known impedance load, e.g., fifty ohms, and (d) either a known calibration voltage or a known current being applied at a precise input level to a known load from an RF calibration source. Then the digital signal processor computes and stores the correction coefficients based on the voltage and current signal values obtained under these conditions (a) to (d). These coefficients are obtained for each of the calibration frequencies in the overall range of interest. When the system is operated at a particular selected operating frequency, the stored correction coefficients are applied to the voltage and current pickup signals to obtain corrected voltage, corrected current, and a corrected load impedance value.

Computing the amplitudes and relative phase of the voltage and current signals is carried out in the digital signal processor. For any operating frequency between successive calibrating radio frequencies for which the correction coefficients are stored, correction coefficients are applied by interpolating between stored values for each such correction coefficient for the calibration frequencies above and below the selected operating frequency.

The voltage and current probe has a metal housing having a cylindrical bore therethrough, and first and second recesses, the recesses each opening to said bore for an axial distance. Voltage and current sensor boards fit into these recesses, as discussed shortly. There is a center conductor extending along the axis of the bore and a cylindrical insulator within the bore. The insulator surrounds the center conductor and extends radially between the conductor and the housing. A voltage sensor board is mounted in the first recess and has a capacitive pickup plate facing radially towards the axis of the bore. The current sensor board is mounted in the second recess and has an elongated inductive pickup conductor, e.g., a wire, positioned to face radially towards the the of the bore and extending axially for the predetermined distance mentioned earlier. In a preferred embodiment, the first and second recesses are positioned opposite one another on the metal housing across the axis of the bore.

In many possible embodiments the voltage sensor board and current sensor board each can include, in order radially outward, the capacitive plate or pickup wire, an insulator layer, a ground plate completion conductive layer, and a circuit board carrying voltage pickup components, with at least one electrical conductor passing from the capacitive plate or inductive wire through openings in the insulator layer and the ground plate completion conductive layer to said respective voltage or current pickup components.

In similar fashion, the current sensor board can be formed, in order radially outward, of the inductive pickup conductor, an insulator layer, a ground plate completion conductive layer, and a circuit board carrying current pickup components. At least one electrical conductor passes from each end of the inductive pickup conductor through openings in the insulator layer and ground plate completion conductive layer to the current pickup components. Preferably the voltage and current pickup components are symmetrically distributed upon the respective boards, both geometrically and electrically.

The above and many other embodiments of this invention will become apparent from the ensuing detailed description of a preferred example, which is to be read in conjunction with the accompanying Drawing.

BRIEF DESCRIPTION OF THE DRAWING

FIG. 6 is a schematic diagram for explaining transmission line characteristics of this invention.

FIG. 7 is a simplified schematic for explaining the voltage sensor of this embodiment.

FIG. 8 is a redrawn schematic for explaining the voltage sensor.

FIG. 9 is a simplified schematic for explaining the current sensor of this embodiment.

DETAILED DESCRIPTION OF THE PREFERRED EMBODIMENT

Figure 1:
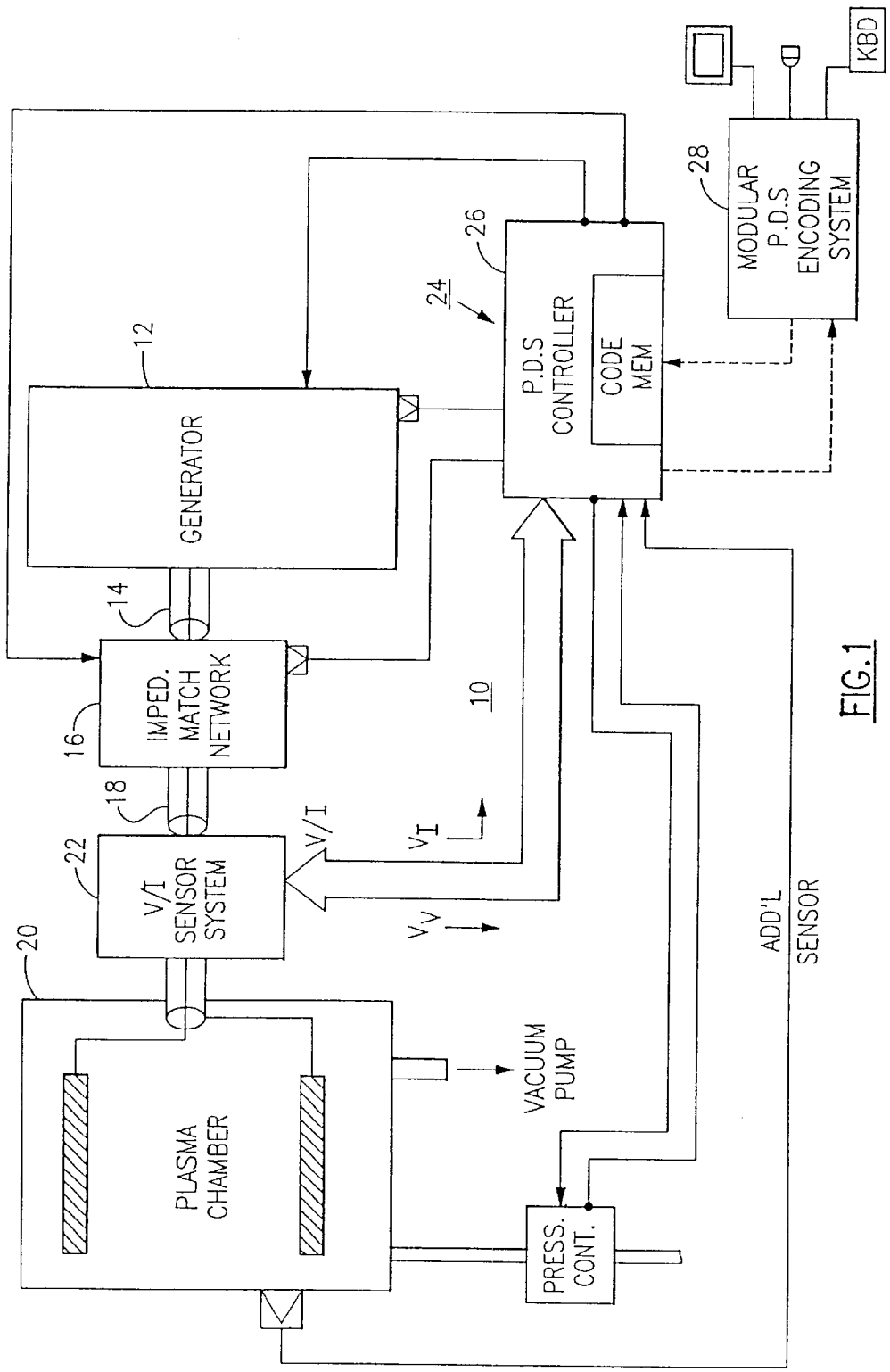
FIG. 1 is a block diagram of an RF plasma chamber, with associated RF plasma generator, impedance match network, V-I sensor, and V-I analysis circuitry, according to an embodiment of this invention.

With reference to the Drawings, and initially to FIG. 1, a plasma process arrangement 10, e.g., for etching a silicon wafer or other workpiece, has an RE power generator 12, which produces RE power at a prescribed frequency, e.g., 13.56 MHz at a predetermined power level, such as one kilowatt. The generator 12 supplies RE power along a conduit 14 to a matching network 16. The output of the matching network 16 is coupled by a power conduit 18 to an input of a plasma chamber 20. A probe voltage and current pickup device 22 picks up a voltage sample $V_V$ that represents the RF voltage $V_{RF}$ and also picks up a current sample voltage $V_1$ that represents the RF current $I_{RF}$ of the applied RE power as it enters the input to the chamber 20. The chamber 20 has a vacuum conduit associated with a not-shown vacuum pump and a gas inlet through which a noble gas, e.g., argon, is introduced into the chamber. The voltage and current samples $V_V$ and $V_1$ are fed to a voltage and current (V-I) baseband probe arrangement 24 which measures the magnitudes or amplitudes of the applied voltage and current, and also computes the phase angle $\Phi$ between the applied voltage and current waveforms. These three values can be computed with high accuracy, and can in turn be used to calculate other parameters. In this arrangement, there is a digital controller that is programmable, e.g., by means of an external computer 28 configured with a modular P.D.S. encoding system. The controller 26 can be configured to control the RE generator 12, the phase and magnitude factors for the impedance match net 16, and other additional elements, such as a pressure controller 30 for the gas pressure supplied to the chamber 20. There can be additional sensors connected between the controller 26 and elements such as the chamber 20 and the RF generator 12. This configuration is discussed at length in copending U.S. Pat. Appln. Ser. No. 09/031,879, filed Feb. 27, 1998, by Daniel F. Vona, et al. having a common assignee herewith.

The baseband V-I probe permits accurate determination of voltage amplitude |V|, current amplitude |I|, and phase $\Phi$ between voltage and current for an RF (radio frequency) signal. This can be in the range of 0.200 MHz to 67.8 MHz, permitting the user to analyze a plasma with greater precision than has been possible with more conventional analog techniques. The same concept can be applied beyond these frequencies to other ranges. End results of this improved capability include improved process repeatability, improved process endpoint determination, higher yields, and more consistent yields. The V-I probe, when employed in connection with the RF path in an RF plasma system, allows the user to achieve a higher degree of control, and to achieve control using parameters beyond simply peak voltage and current values of the RF wave. With the baseband V-I probe arrangement the user can control the plasma process based on power delivered to the plasma, whether at the RF frequency of the generator or at any other frequency, impedance of the plasma, either at the frequency of the RF waveform or at any frequency within the bandwidth of the arrangement. For example, harmonic analysis can be used for a more accurately determination of completion for an etching step in an integrated circuit (IC) wafer.

It should be appreciated that with this probe arrangement, the above parameters are obtained with an improvement in smaller size, lower cost, lower drift, higher accuracy (especially at high phase angles) and with greater flexibility of integration than with existing probe systems or techniques. Moreover, unlike conventional, diode based systems, the arrangement of permits harmonic analysis and permits plasma power and impedance measurements at user-selected frequencies. Also, this probe arrangement permits the data to be easily exported, and facilitates remote user operation and monitoring.

The phase measurement taken in this manner is highly accurate, i.e., to within one-fifth degree, i.e., 0.2°. This cannot be achieved with other techniques, such as zero-crossing detectors.

Of course, this probe can be used over a wide range of frequencies, including other process RF frequencies such as 27.12 MHz, 40.68 MHz, etc.

A problem of achieving precision in measuring the voltage, current, and phase arises from the fact that the voltage and current sensors have to be of finite size in order to pick up a detectable signal. Therefore, this invention addresses the problem of creating a super-high matching directivity voltage and current sensor and allowing for the calibration of the non-zero length of each. An ideal voltage and current sensor should produce pickup signals Vv and Vi that represent a zero-length insertion point. This is unrealistic, however, because the sensor has to be of finite size in order to sense the voltage and current. The voltage and current sensor produces a low-level signal which has a well-defined relationship between itself and the high level signal being detected and measured. Accordingly, the achievement of this invention is to create a voltage and current sensor with super-high matching directivity, and to generate a calibration algorithm to account for, and compensate for the non-zero length of the sensor elements.

Figure 2A:
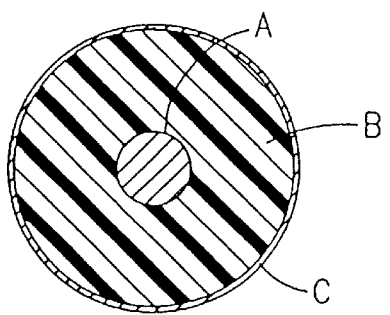
FIGS. 2A and 2B are end and side sectional views illustrating the transmission line structure of the sensor of this invention.
Figure 2B:
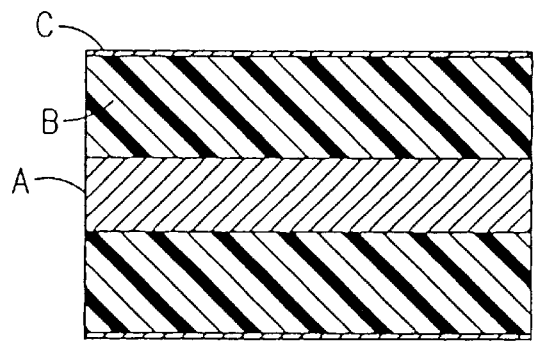
Figure 3:
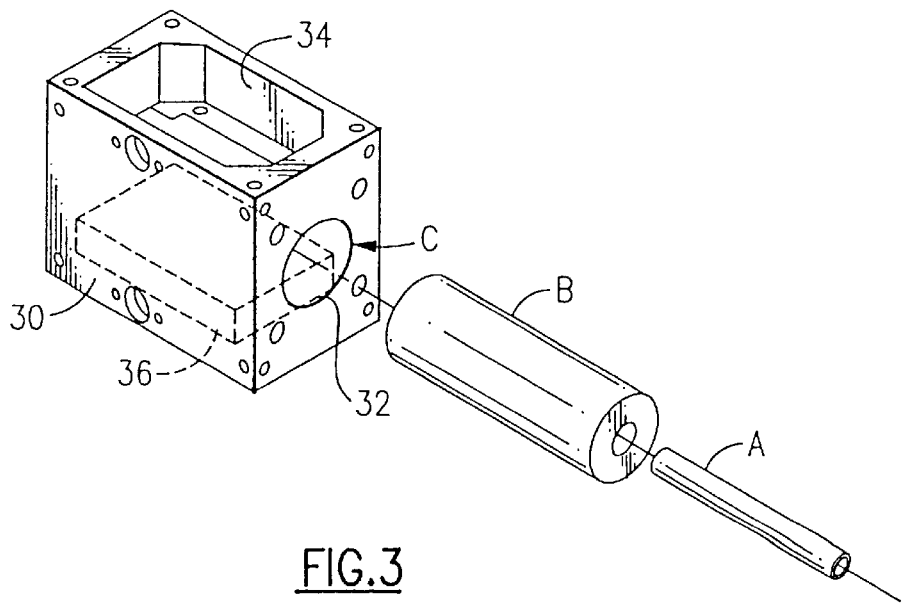
FIG. 3 is an exploded sectional view of the sensor of an embodiment of the invention.

Details of the hardware for the sensor 22 can be appreciated from FIGS. 2A and 2B, which represent the V/I sensor 22 as a length of coaxial cable. The sensor 22 is created to behave as a length of coaxial transmission line, with a center conductor A, a cylindrical insulator layer B of dielectric material such as air, Teflon, ceramics, or other suitable material, and an outer conductor C that is coaxial with the center conductor A and the insulator B. The remaining structure of the sensor as shown in FIGS. 3, 4, 5, 4A to 4D, and 5A to 5D, serves to detect the voltage $V_{RF}$ appearing on the center conductor A and the current $I_{RF}$ that flows through it. As shown in FIG. 3, the outer conductor C is formed as a generally rectangular aluminum housing 30, with an axial bore 32 in which the insulator B and center conductor A are positioned. The housing 30 also has a recess 34 on one side (here, the top) in which a voltage sense circuit board is fitted, and another recess 36 opposite the first recess in which a current sense circuit board is fitted. Various plates and attachments fit on this, but are not shown here. The recesses 34 and 36 extend radially inward and meet with, that is, open onto, the center bore 32. This structure maintains the electrical characteristics of a coaxial line, but allows for the electric signals to be sensed.

The housing 30 here has a square outside and a cylindrical hole 32 on the inside. Due to the fact that the RF current does not completely penetrate an electrical conductor, i.e., due to "skin effect," the current travels through the housing near the central bore 32, and not through the square portion beyond it. Consequently, the measurement of the RF current and voltage requires introducing the current and voltage measurement elements into the structure shown in FIG. 2 at or close to the cylindrical surface defined by the bore 32.

Figure 4:
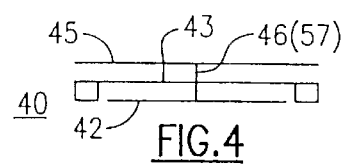
FIG. 4 is a sectional view of the voltage sensor board of this embodiment.
Figure 4A:
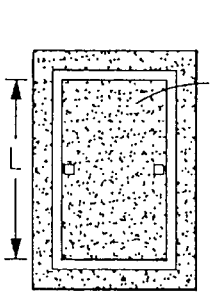
FIGS. 4A to 4D are plan views showing respective layers of the voltage sensor board.
Figure 4B:
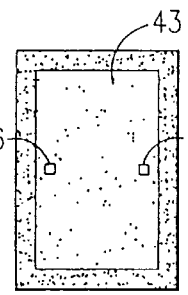
Figure 4C:
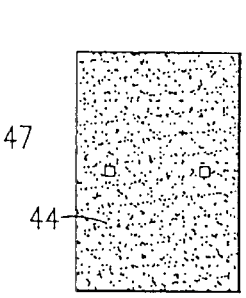
Figure 4D:
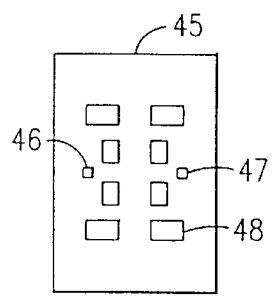

The printed circuit board 20 has a capacitive plate 52 formed thereon, as shown in section in FIG. 4, shown also in FIG. 4A. The conductive plate has a length L and is positioned facing the center conductor A and parallel with it. This is placed on an insulator layer 43 (FIG. 4B) on which is mounted a ground completion conductive layer 44 (FIG. 4C), which also has a portion surrounding the margin of the insulator layer 43. A printed circuit board 45 is positioned on the side radially away from the capacitive plate 42 (FIG. 4D). There are feed-throughs 46 and 47 disposed at transverse positions on the plate 42 and on a line midway beween its ends. The feed-throughs pass through the layers 43, 44, and 45 to connect to circuit elements 48 on the PCB 45. As shown here, the elements 48 should be distributed symmetrically on the board, both axially and transversely.

Figure 5:
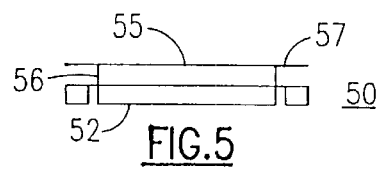
FIG. 5 is a sectional view of the current sensor board of this embodiment.
Figure 5A:
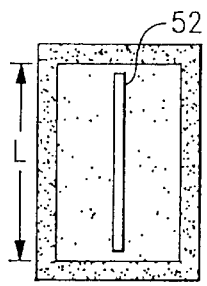
FIGS. 5A to 5D are plan views showing respective layers of the current sensor board.
Figure 5B:
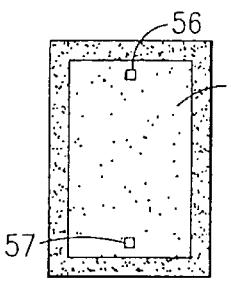
Figure 5C:
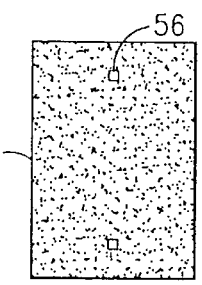
Figure 5D:
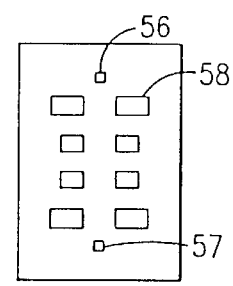

The printed circuit board 50 with an inductive wire 52 formed (i.e., printed) thereon is shown in section in FIG. 5, shown also in FIG. 5A. The inductive wire has a length L and is positioned facing the center conductor A and parallel with it. This wire 52 is placed on an insulator layer 53 (FIG. 5B) on which is mounted a ground completion conductive layer 54 (FIG. 5C), which also has a portion surrounding the margin of the insulator layer 53. A printed circuit board 55 is positioned on the side radially away from the inductive wire 52 (FIG. 5D). There are feed-throughs 56 and 57 disposed at the ends of the inductive wire 52 and passing through the layers 53, 54, and 55 to connect to circuit elements 58 on the PCB 55. As shown here, the elements 58 should be distributed symmetrically on the board, both axially and transversely. Also, the voltage and current sensor elements should be the same length.

In this embodiment, the voltage and current sensing elements are placed on opposite sides of the center conductor in order to minimize crosstalk between the two circuit boards 40 and 50. In each case the ground completion layer 44, 54 serves as the ground plane layer C for the outer conductor, and also completes the return path for current in the main coaxial line section with minimal disruption.

Theory of Operation of Voltage and Current Sense Printed Circuit Boards:

Due to the laws of AC field and wave electromagnetics, the voltage present on the center conductor of the coaxial transmission line (FIG. 2) induces a voltage in the metallic plate 42, (similar in operation to a capacitor). These same laws of electromagnetics cause the current traveling through the center conductor of the coaxial transmission line to induce a current in the metallic wire 52 (similar in operation to a transformer). The design of the coaxial line section (including printed circuit board lengths) is constrained by the factors of: (a) breakdown voltage; (b) current carrying capacity; (c) characteristic impedance; and (d) voltage and current pickup sensitivity.

Breakdown voltage is determined by the distance between the center and outer conductors and the breakdown voltage of the insulating material between them. The greater the distance, the larger the breakdown voltage. Current carrying capacity is determined by the size of each of the two conductors; with the size of the inner conductor being the main factor because of its smaller diameter. The larger the diameter, the larger the current carrying capacity. Characteristic impedance is determined by the diameters of the inner and outer conductors and the dielectric constant of the insulating material between them. Finally, pickup sensitivity is determined by the length of each pickup and the distance between each pickup and the inner conductor. The net effect is that increasing the length of the capacitive plate 42, or the metallic wire 52 or moving either closer to the center conductor of the coaxial transmission line will increase the amount of voltage or current, respectively, that is induced in each. A proper balance between all four of these factors is necessary for optimal operation of the V/I sensor.

Symmetry of each PCB 40, 50 about the center conductor of the coaxial line section (in both the long and short directions) is the key to achieving identical sensitivity to the forward and reverse traveling voltage and current waves present in the coaxial line section. Identical sensitivity produces a balanced system with a balanced ground system. This sensitivity is referred to as "matching directivity". Accuracy of the sensor over wide impedance ranges demands an almost perfect sensitivity (or a super high matching directivity.)

Examination of Linearity:

With the coaxial voltage sensing structure outlined above, additional design goals where placed upon the circuit which would be present on the outer layer 45 or 55 (circuit construction) for each sensing PCB. One of these design goals is to produce a voltage signal that was a linear representation (in both phase and magnitude) of the voltage on the main line section. The second design goal is to produce a voltage signal that is a linear representation (in both phase and magnitude) of the current signal on the main line section. With these constraints satisfied, the magnitudes of the voltage and current signal as well as the phase angle between these signals can easily be calculated according to the equations below:

$$V_D = V_{VI} * V_G \tag{1}$$

$$I_D = V_{II} * I_G \tag{2}$$

$$\Phi = \Phi V_{VI} - \Phi V_{II} \tag{3}$$

Where:

$V_D$: Voltage Displayed; $V_{VI}$: Voltage at Voltage Input $V_G$: Voltage Gain Coefficient; $I_D$: Current Displayed $V_{II}$: Voltage at Current Input; $I_G$: Current Gain Coefficient; $\Phi$: Phase Angle Between Voltage and Current; $\Phi V_V$: Phase of Voltage at Voltage Input; $\Phi V_{II}$: Phase of Voltage at Current Input Laboratory experimentation reveals that the original design objective of linear in phase and magnitude is not possible with conventional circuitry. The equations presented in (1), (2), and (3) above caused significant computational errors when the V/I Probe was connected to low and high impedance loads; with the error increasing with frequency.

Calibration Algorithm Description:

Another aspect of this invention involves an analysis of the equations in (1), (2), and (3) to demonstrate that they not valid. Next, the invention involves finding the equations that actually describe sensor behavior. Finally, the invention involves how to properly calibrate for the hardware described hereinabove in such a way as to allow the new equations to be valid over a maximum frequency range and impedance range.

Since the V/I sensor was created as a coaxial line segment, the best place to start is to take a look at transmission line theory. Transmission line theory states that the voltage and current values produced at different positions on a transmission line are a function of this position. This is shown graphically in FIG. 6, in which $V_G$ and $Z_G$ are applied RF voltage and impedance of the RF generator, respectively.

Equations (4) and (5) below define the rules that govern the transmission line system shown in FIGS. 2A and 2B.

$$V(x)=I_L(Z_L*\cos h(\gamma*x)+Z_0*\sin h(\gamma*x)) \qquad (4)$$

$$I(x)=(I_L/Z_0)*(Z_L*\sin h(\gamma*x)+Z_0*\cos h(\gamma*x)) \qquad (5)$$

Where:

V(x): Voltage as a function of position on the line; 1(x): Current as a function of position on the line; x: Position on the line away from $Z_L$ (with $Z_L$ being x=0); $I_L$: Current at the load (at x=0); $Z_L$: Load impedance (at x=0); $V_L$: Voltage at load (at x=0); $Z_O$: Characteristic impedance of transmission line γ: Propagation constant of transmission line In a lossless transmission line, the two constants $Z_0$ and γ are defined as:

$$Z_0=\sqrt{(L/C)} \qquad (6)$$

$$\gamma=j*\omega*\sqrt{(L*C)} \qquad (7)$$

Where:

L: Inductance of transmission line; C: Capacitance of transmission line; ω: Frequency interest (radians per second)

Examination of Voltage Sensor:

Equation (4) clearly shows that the voltage produced on a transmission line as a function of position is only constant for the situation when $Z_L=Z_0$. For all other values of $Z_L$, the voltage must be computed with equation (4).

As stated previously, the voltage sensor is created by placing the metal capacitive plate 42 of length L a fixed distance from the center conductor of a coaxial transmission line. This geometry creates a capacitance between the center conductor and the metal plate, allowing for a small portion of the energy in the line to be tapped. It is this capacitance and the additional frequency shaping circuitry that functions as a voltage sensor. FIG. 7 shows a rough sketch of the voltage sensor, where:

L: Length of parallel voltage sensor plate along transmission line center conductor VP: Voltage at center of pickup (capacitive plate 42)

$C_L$: Load capacitance for frequency smoothing of magnitude response $R_L$: Load resistance for frequency smoothing of magnitude response.

In practice, the above electromagnetic geometry is constructed into a printed circuit board allowing easy construction, maintenance, repeatability, and reliability.

When a load is attached to a transmission line, the forward and reverse traveling AC waves combine to create a standing wave pattern originating from the load. If the impedance of load exactly matches the characteristic impedance of the transmission line, the standing wave pattern is constant in magnitude for the entire length of the transmission line. Since a perfect match between the impedance of the load and the impedance of the line is possible only in theory, a standing wave will always exist and the voltage will not be a constant value across the length of the metal plate of the voltage sensor. Hence, equation (4) must be utilized to properly calculate the voltage at point $V_P$. The challenge is to create an equation that can be calculated in a digital signal processor (DSP), micro-processor, etc. to produce an accurate result. To solve this, we graphically combine equation (4) with FIG. 7 to produce the circuit shown in FIG. 8. Here, as series of n capacitor elements represent the capacitance formed between the metal plate 42 on the voltage pickup and the inner conductor A of the transmission line. In this case, X: Position on voltage sensor plate for equation (4); L: Length of voltage sensor plate parallel to the transmission line conductor A; n: Number of equal length pieces length L is divided into; $V_1, V_2, \ldots, V_n$: Voltages calculated from equation (4) at n different values of X; $I_1, I_2, \ldots, I_n$: Currents produced due to voltages $V_1, V_2, \ldots, V_n$; ΔC: Partial capacitance of voltage sensor created by capacitance divided into n parts; $I_P$: Sum of currents $I_1, I_2, \ldots, I_n$; total current leaving point $V_P$; $v_P$: Voltage at center of pickup plate 42; $C_L$: Load capacitance for frequency smoothing of magnitude response; $R_L$: Load resistance for frequency smoothing of magnitude response Proper circuit analysis of FIG. 8 involves implementation of Kirchoff's current law (KCL). Doing this we get:

$$I_P = \sum_{k=1}^{n} I_k \qquad (8)$$

Additionally, FIG. 8 shows the following relationships:

$$I_P=V_P/Z_P$$

$$=V_P/(Z_{CL}\|R) \qquad (9)$$

$$\Delta C=C/n \qquad (10)$$

$$\Delta Z_C=1/(j*\omega*\Delta C) \qquad (11)$$

$$I_k=(V_n-V_p)/(\Delta Z_C) \qquad (12)$$

$$\Delta X=L/n \qquad (13)$$

Where C is the capacitance formed by voltage sensor parallel plate 42. Combining equations (10) and (13) yields:

$$\Delta C=C*(\Delta X)/L \qquad (14)$$

Combining equations (14) and (11) yields:

$$\Delta Z_C = 1/(j*\omega*C*\Delta X/L) \qquad (15)$$
$$= L/(j*\omega*C*\Delta X)$$

Combining equations (15) and (12) yields:

$$I_k = (V_n - V_P)/L/(j*\omega*C*\Delta X) \qquad (16)$$
$$= j*\omega*C*(V_n - V_P)*\Delta X/L$$

The summation notation in equation (8) is an approximation only, and hence, not exact. An exact solution requires increasing n to ∞, which is easily done with an integral. Rewriting equation (8) in integral notation yields:

$$I_P = \int_0^L 1\, dl \quad (17)$$

Where dl is formed from $I_k$:

$$dI = j*\omega*C*(V(X)-V_P)*dX/L \quad (18)$$

Substituting equation (18) into (17) and working with the result yields:

$$I_P = \int_0^L \frac{j \cdot \omega \cdot C \cdot (V(X) - V_P)}{L} dX \quad (19)$$

$$= \frac{j \cdot \omega \cdot C}{L} \cdot \int_0^L (V(X) - V_P) dX$$

$$\frac{I_P}{j \cdot \omega \cdot C} = \frac{1}{L} \cdot \int_0^L (V(X) - V_P) dX$$

$$= \frac{1}{L} \cdot \left( \int_0^L V(X) dX - V_P \cdot L \right)$$

$$\frac{I_P}{j \cdot \omega \cdot C} = -V_P + \frac{1}{L} \cdot \int_0^L V(X) dX$$

Combining equations (19), (9), and (4) yields:

$$\frac{V_P}{(Z_P) \cdot (j \cdot \omega \cdot C)} = -V_P + \frac{1}{L} \cdot \int_0^L [I_L \cdot (Z_L \cdot \cosh(\gamma \cdot X) + Z_0 \cdot \sinh(\gamma \cdot X)] dX \quad (20)$$

Solving equation (20) for $V_P$ (the voltage at the pickup plate 42) yields:

$$V_P \cdot \left[1 + \frac{1}{(Z_P) \cdot (j \cdot \omega \cdot C)}\right] = \frac{1}{L} \cdot \int_0^L [I_L \cdot (Z_L \cdot \cosh(\gamma \cdot X) + Z_0 \cdot \sinh(\gamma \cdot X)] dX \quad (21)$$

$$= \left[\frac{1}{L} \cdot \int_0^L [I_L \cdot (Z_L \cdot \cosh(\gamma \cdot X))] dX\right] +$$

$$\left[\frac{1}{L} \cdot \int_0^L I_L \cdot [Z_0 \cdot (\sinh(\gamma \cdot X))] dX\right]$$

$$= \left(\frac{I_L \cdot Z_L}{L} \cdot \int_0^L \cosh(\gamma \cdot X) dX\right) +$$

$$\left(\frac{I_L \cdot Z_0}{L} \cdot \int_0^L \sinh(\gamma \cdot X) dX\right)$$

$$= \frac{I_L \cdot Z_L}{L \cdot \gamma} \cdot (\sinh(\gamma \cdot X))_{0 \ldots L} +$$

$$\frac{I_L \cdot Z_0}{L \cdot \gamma} \cdot (\cosh(\gamma \cdot X))_{0 \ldots L}$$

$$= \frac{I_L \cdot Z_L}{L \cdot \gamma} \cdot \sinh(\gamma \cdot L) +$$

$$\frac{I_L \cdot Z_0}{L \cdot \gamma} \cdot (\cosh(\gamma \cdot L) - 1)$$

$$= I_L \cdot Z_L \cdot \frac{\sinh(\gamma \cdot L)}{L \cdot \gamma} + I_L \cdot Z_0 \cdot \left(\frac{\cosh(\gamma \cdot L) - 1}{L \cdot \gamma}\right)$$

Since L is a constant always and γ is a constant at a given frequency (the V/I Probe is calibrated at separate frequencies), we can re-write the above as:

$$V_P \cdot \left[1 + \frac{1}{(Z_P) \cdot (j \cdot \omega \cdot C)}\right] = I_L \cdot Z_L \cdot A + I_L \cdot Z_0 \cdot B$$

Also, since $Z_P$ and $j*\omega*C$ will be constant at a given frequency, the above equation can be written as:

$$V_P \cdot D = I_L \cdot Z_L \cdot A + I_L \cdot Z_0 \cdot B \quad (22)$$

$$\boxed{V_P = \frac{I_L \cdot Z_L \cdot A + I_L \cdot Z_0 \cdot B}{D}}$$

Where:

$A = \sinh(\gamma*L)/(\gamma*L)$ (Constant for a single frequency)

$B = (\cosh(\gamma*L) - 1)/(\gamma*L)$ (Constant for a single frequency)

$D = 1 + 1/(Z_P * j * \omega * C)$ (Constant for a single frequency)

The expression in equation (22) has three constants. This equation is very important to the second part of this invention and will be simplified later.

Examination of Current Sensor:

Equation (5) clearly shows that the current produced on a transmission line, as a function of position, is only constant for the situation when $Z_L = Z_0$. For all other values of $Z_L$, the current can be calculated with equation (5).

As stated previously, the current sensor is created by placing a conductive wire of length L a fixed distance from the center conductor A of a coaxial transmission line. This geometry creates a mutual inductance between the center conductor and the wire, and allows for a small portion of the energy in the line to be tapped. It is this mutual inductance and the additional frequency shaping circuitry that functions as a current sensor. FIG. 9 below shows a rough schematic of the current sensor. Here, L is the length of the parallel current sensor wire 52 along the transmission line conductor, $Z_I$ is the current circuit load impedance, and $V_I$ is the voltage across the circuit load.

In practice, the above electromagnetic geometry is constructed into a printed circuit board for easy construction, maintenance, repeatability, and reliability.

When a load is attached to a transmission line, the forward and reverse traveling waves combine to create a standing wave pattern originating from the load. If the impedance of load exactly matches the characteristic impedance of the transmission line, the standing wave pattern is constant in magnitude for the entire length of the transmission line. Since a perfect match between the impedance of the load and the impedance of the line is possible only in theory, a standing wave will always exist and the current will not be a constant value across the length of the metal wire of the current sensor. Hence, equation (5) must be utilized to properly calculate the voltage across impedance $Z_I$ produced by the current $I_I$. The challenge, again, is to create an equation that can be calculated in a DSP, microprocessor, etc. to produce an accurate result. To solve this, we graphically combine equation (5) and FIG. 9 to produce FIG. 10, where the transformer pairs represent the mutual inductance between the inner conductor of the transmission line and the current pickup wire of the current sensor geometry, where:

X: Position on current sensor wire for equation (5)
L: Length of current sensor wire parallel to the transmission line conductor A
n: Number of equal length pieces length L is divided into
$I_1, I_2, \ldots I_n$: Currents calculated from equation (5) at n different values of X
$Z_1$: Load impedance for frequency smoothing of magnitude response
$V_1$: Voltage produced across load $Z_1$ due to currents $I_1, I_2, \ldots I_n$
$\Delta M$: Partial mutual inductance created by mutual inductance/n
$\Delta L_1$: Partial primary transformer inductance created by primary inductance, divided into n parts
$\Delta L_2$: Partial secondary transformer inductance created by secondary inductance, divided into n parts.

Figure 10:
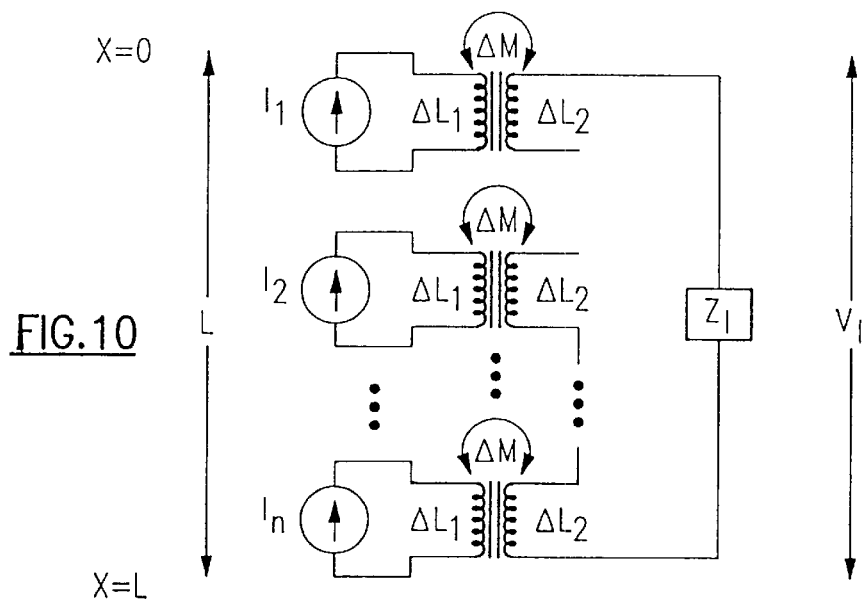
FIG. 10 is a redrawn schematic for explaining the current sensor.
Figure 11:
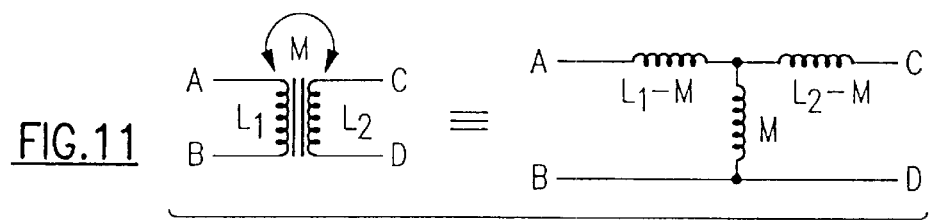
FIG. 11 is a simplified diagram showing equivalence of mutual inductance to T-inductance.

The next step is to conduct circuit analysis on the circuit in FIG. 10. When analyzing a circuit with mutual inductance elements, it is usually most efficient to replace each mutual inductor with its "T" inductor equivalent circuit. This conversion is shown pictorially in FIG. 11.

Figure 12:
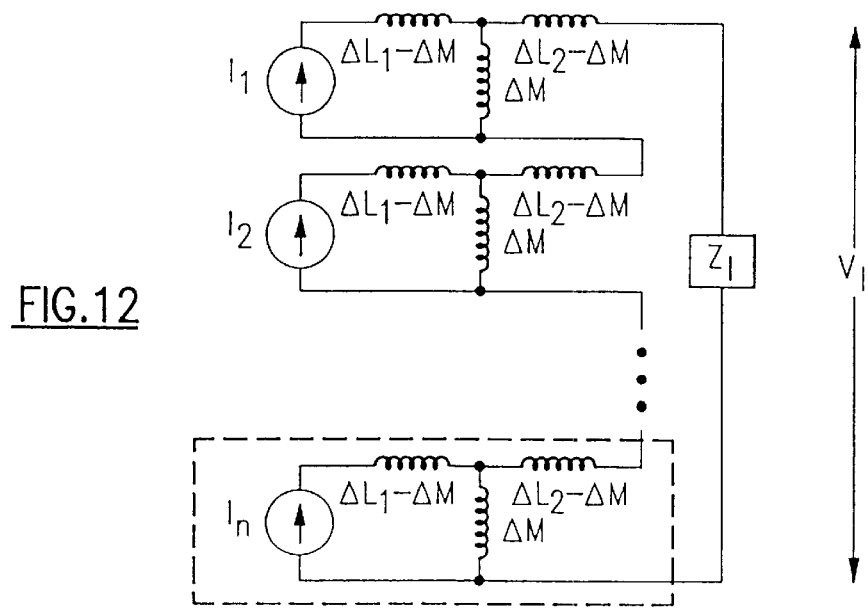
FIG. 12 is an equivalent circuit diagram corresponding to that of FIG. 10.
Figure 13:
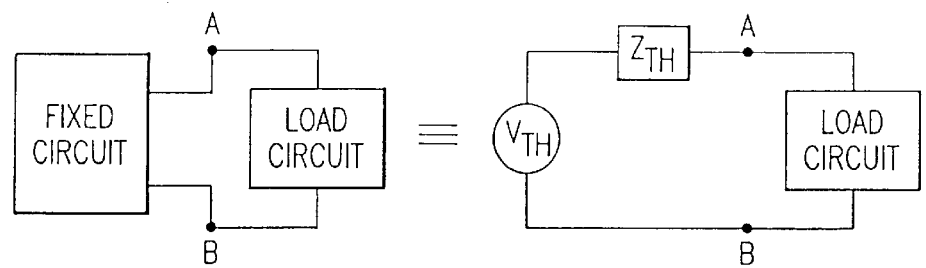
FIG. 13 is a circuit diagram explaining equivalence according to Thevenin's Theorem.
Figure 14:
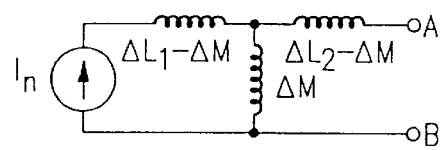
FIG. 14 is an illustration of a working circuit for explaining Thevenin conversion.

FIG. 12 is a simplified version of FIG. 10, but is still too complicated for easy circuit analysis. Hence, the next step is to simplify FIG. 12. The best place to start the simplification is to replace each portion of the circuit (e.g., with the dashed box around it) with its Thevenin equivalent circuit. A Thevenin circuit utilizes the Thevenin theorem (which states that any excited, fixed circuit network can be replaced with an equivalent ideal voltage source and series impedance) to complete the transformation. The Thevenin theorem is shown pictorially in FIG. 13. The circuit for Thevenin conversion is shown in FIG. 14. The Thevenin impedance ($Z_{TH}$) is found by replacing the current source with an open circuit (representation of infinite impedance) and calculate the remaining impedance seen when "looking" between the terminals marked A and B:

$$Z_{TH} = j\omega * (\Delta L_2 - \Delta M + \Delta M) \quad (23)$$
$$= j\omega * \Delta L_2$$

The Thevenin voltage is found by computing $V_{AB}$ with an open circuit between the terminals marked A and B:

$$V_{AB} = V_{TH}$$

$$V_{TH} = I_n * (j\omega \Delta M) \quad (24)$$

Figure 15:
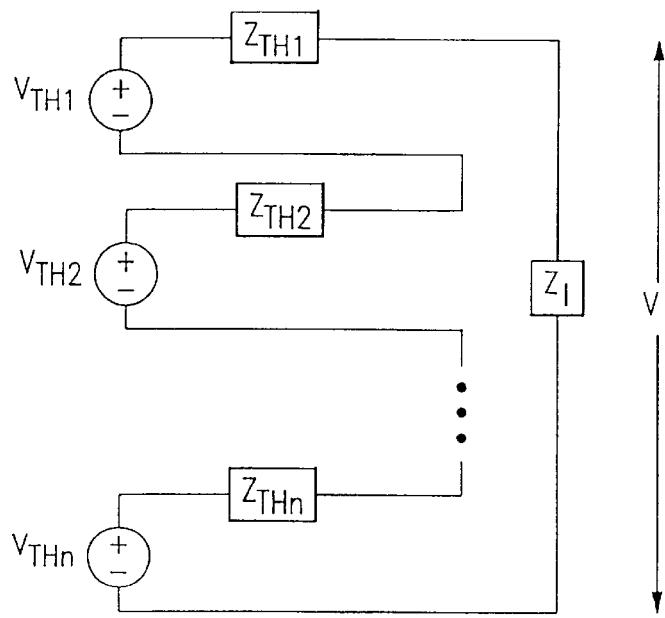
FIG. 15 is a Thevenin-equivalent circuit corresponding to FIG. 12.
Figure 16:
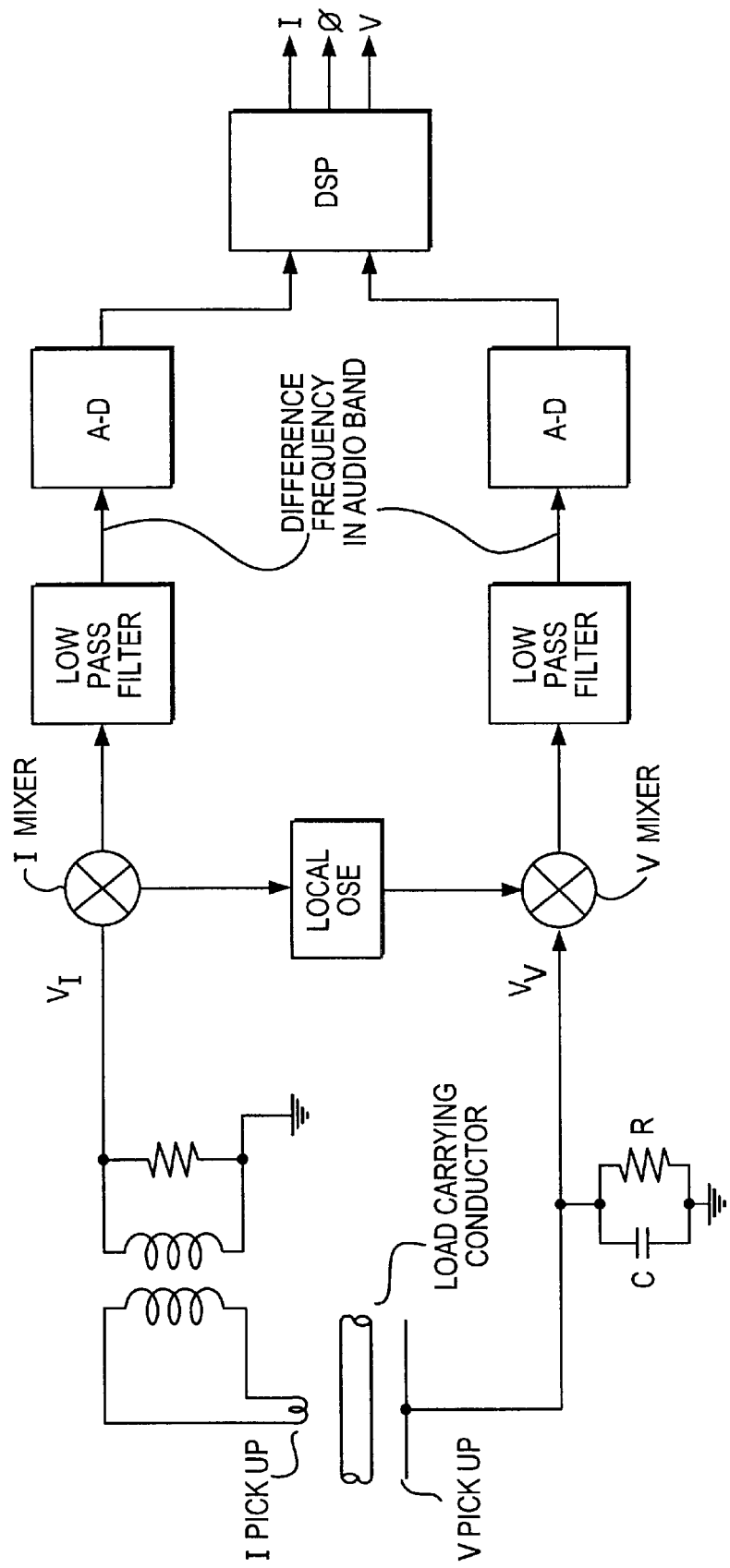
FIG. 16 is a simplified schematic diagram illustrating the V-I sensor system and the impedance matching network of the preferred embodiment.

FIG. 15 represents the circuit of FIG. 12, simplified with the Thevenin equivalent circuits in place, where $V_{TH1}$: Equivalent Thevenin voltage from sub circuit containing $I_1$ $Z_{TH1}$: Equivalent Thevenin impedance from sub circuit containing $I_1$ $V_{TH2}$: Equivalent Thevenin voltage from sub circuit containing $I_2$ $Z_{TH2}$: Equivalent Thevenin impedance from sub circuit containing $I_2$ $V_{THn}$: Equivalent Thevenin voltage from sub circuit containing $I_n$ $Z_{THn}$: Equivalent Thevenin impedance from sub circuit containing $I_n$ The voltage of interest in the complete circuit analysis is voltage $V_I$ formed across Impedance $Z_I$ by current $I_I$ (not shown in FIG. 15) Hence, it becomes necessary to solve for current $I_I$. This is done by proper use of Kirchoff's Voltage Law (KVL):

$$V_{THn} - \ldots - V_{TH2} - V_{TH1} + I_I * (Z_{THn} + \ldots + Z_{TH2} + Z_{TH1}) = 0 \quad (25)$$

Converting equation (25) to summation notation yields:

$$I_I \cdot \left( \sum_{k=1}^{n} Z_{THk} + Z_I \right) = \sum_{k=1}^{n} V_{THk} \quad (26)$$

Combining equations (23), (24), and (26) yields:

$$I_I \cdot \left( \sum_{k=1}^{n} j \cdot \omega \cdot \Delta L_2 + Z_I \right) = \sum_{k=1}^{n} I_k \cdot j \cdot \omega \cdot \Delta M \quad (27)$$

$$I_I \cdot (j \cdot \omega \cdot L_2 + Z_I) = \sum_{k=1}^{n} I_k \cdot j \cdot \omega \cdot \Delta M$$

Next, the mathematical definition of $\Delta M$ (partial mutual inductance) needs to be established:

$$\Delta M = M/n \quad (28)$$

$$\Delta X = L/n \quad (29)$$

Combining equations (28) and (29) yields:

$$\Delta M = M * (\Delta X)/L \quad (30)$$

$$\Delta M = M * (\Delta X)/L \quad (31)$$

Combining equations (30) and (27) yields:

$$I_I \cdot (j \cdot \omega \cdot L_2 + Z_I) = \sum_{k=1}^{n} I_k \cdot j \cdot \omega \cdot \frac{M \cdot \Delta X}{L} \quad (32)$$

The summation notation in equation (32) is an approximation only, and hence, not exact. An exact solution requires increasing n to ∞, which is easily done with an integral. Rewriting equation (32) in integral notation yields:

$$I_I \cdot (j \cdot \omega \cdot L_2 + Z_I) = \int_0^L I(x) \cdot \frac{j \cdot \omega \cdot M}{L} dx \quad (33)$$

Combining equations (33) and (5) yields:

$$I_I \cdot (j \cdot \omega \cdot L_2 + Z_I) = \frac{j \cdot \omega \cdot M}{L} \cdot \int_0^L \left[ \frac{I_L}{Z_0} \cdot (Z_L \cdot \text{Sinh}(\gamma \cdot x) + Z_0 \cdot \text{Cosh}(\gamma \cdot x)) \right] dx \quad (34)$$

$$I_I \cdot (j \cdot \omega \cdot L_2 + Z_I) = \frac{j \cdot \omega \cdot M}{L} \cdot \left[ \frac{I_L \cdot Z_L}{Z_0} \cdot \left( \frac{\text{Cosh}(\gamma \cdot L) - 1}{\gamma} \right) + I_L \cdot \frac{\text{Sinh}(\gamma \cdot L)}{\gamma} \right]$$

$$I_I \cdot (j \cdot \omega \cdot L_2 + Z_I) = j \cdot \omega \cdot M \cdot \left[ \frac{I_L \cdot Z_L}{Z_0} \cdot \left( \frac{\text{Cosh}(\gamma \cdot L) - 1}{\gamma \cdot L} \right) + I_L \cdot \frac{\text{Sinh}(\gamma \cdot L)}{\gamma \cdot L} \right]$$

$$I_I \cdot (j \cdot \omega \cdot L_2 + Z_I) = j \cdot \omega \cdot M \cdot \left( \frac{I_L \cdot Z_L}{Z_0} \cdot B + I_L \cdot A \right)$$

-continued $$I_I = \left(\frac{j\cdot\omega\cdot M}{j\cdot\omega\cdot L_2 + Z_I}\right)\cdot\left(\frac{I_L\cdot Z_L}{Z_0}\cdot B + I_L\cdot A\right)$$

$$I_I = \left(\frac{j\cdot\omega\cdot M}{j\cdot\omega\cdot L_2 + Z_I}\right)\cdot\left(\frac{B}{Z_0}\cdot V_L + A\cdot I_L\right)$$

Since the voltage across the current circuit load impedance $Z_I$ is $I_I*Z_I$, equation (34) can be simplified as:

$$\boxed{V_I = E\cdot\left(\frac{B}{Z_0}\cdot V_L + A\cdot I_L\right)} \quad (35)$$

Where:

$A = \mathrm{Sinh}(\gamma * L)/(\gamma * L)$ (Constant for a single frequency)

$B = (\mathrm{Cosh}(\gamma * L) - 1)/(\gamma * L)$ (Constant for a single frequency)

$E = (j*\omega*M*Z_I)/(j*\omega*L_2 + Z_I)$ (Constant for a single frequency)

This completes the derivation of the voltage and current pickup circuits. In summary, the two equations the define the output of the voltage (equation (22)) and current (equation (35)) circuits in the V/I sensor. These two equations are restated below for clarity before continuing with derivations:

$$\boxed{V_V = \frac{I_L\cdot Z_L\cdot A + I_L\cdot Z_0\cdot B}{D}} \quad (22)$$

$$\boxed{V_I = E\cdot\left(\frac{B}{Z_0}\cdot V_L + A\cdot I_L\right)} \quad (35)$$

These equations are a good first step, but the end goal of this derivation is to create a set of equations to allow a computer (i.e. DSP) to compensate (calibrate) for the non-ideal effect of the pickup head (as summarized in the above equations.) A cursory glance at the above two equations will show that there are five constants (A, B, D, E, and $Z_0$). Five constants means that there are five unknowns in the calibration. Five unknowns means that five different measurement standards need to be maintained (either equipment or impedance standards) for each frequency. Five points at each frequency are too many. The purpose of the remainder of this derivation section will be to reduce the number of constants needed. Starting with this goal, the above two equations can be rewritten as:

$$V_V = F*V_L + G*I_L \quad (36)$$

$$V_I = H*V_L + J*I_L \quad (37)$$

Where:

F=A/D

G=$Z_0$*B/D

H=E*B/$Z_0$

J=E*A

Equations (36) and (37) now contain only four constants each. Since $V_V$ and $V_I$ will be known voltages (i.e. voltages measured by the analysis section), equations (36) and (37) need to be solved for $V_L$ and $I_L$ (the load voltage and current respectively). Treating equations (36) and (37) as a system of equations and solving the system yields:

$$V_L = (J*V_V - G*V_I)/(F*J - G*H) \quad (38)$$

$$I_L = (F*V_I - H*V_V)/(F*J - G*H) \quad (39)$$

With $V_L$ and $I_L$ solved for, $Z_L$ can easily be calculated by:

$Z_L = V_L/I_L$ $$= (J*V_V - G*V_I)/(F*V_I - H*V_V) \quad (40)$$

Equations (38), (39), and (40) represent how to calculate the load values, but four constants are still too many (four constants means maintaining four unknowns during calibration.) Continuing on, if we remember that:

$$Z_V = V_V/V_I \quad (41)$$

Combining equations (40) and (41) yields:

$$Z_L = (J*Z_V - G)/(F - H*Z_V) \quad (42)$$

Equation (42) still has four unknowns, but it allows $Z_L$ (load impedance) to be computed directly from $Z_V$ (impedance measured by analysis board.) Two of the four unknowns can be calculated from a short circuit and open circuit. These will work well because an open circuit and short circuit are easy to maintain. Working equation (42) with a short circuit at the load ($Z_L = 0$) yields:

$0 = (J*Z_V - G)/(F - H*Z_V)$ $0 = J*Z_V - G$ $J*Z_V = G$ $$Z_V = G/J \quad (43)$$

If a constant $Z_{VS}$ is created to mean the impedance "seen" by the analysis section when $Z_L$ is a short circuit, a new constant is created and equation (43) becomes:

$$Z_{VS} = G/J \quad (44)$$

Equation (44) is a very important result—this will be shown later. Working with equation (42) with an open circuit at the load ($Z_L = \infty$) yields:

$\infty = (J*Z_V - G)/(F - H*Z_V)$ $0 = (F - H*Z_V)/(J*Z_V - G)$ $0 = (F - H*Z_V)$ $H*Z_V = F$ $$Z_V = F/H \quad (45)$$

If a constant $Z_{VO}$ is created to mean the impedance "seen" by the analysis section then $Z_L$ is an open circuit, a new constant is created and equation (45) becomes:

$$Z_{VO} = F/H \quad (46)$$

Again, equation (46) is an important result. Combining equations (42), (44), and (46) yields:

$$Z_L = (J*Z_V - G)/(F - H*Z_V) \quad (47)$$

$$= (Z_V - G/J)/((1/J)*(F - H*Z_V))$$

$$= (J/H)*(Z_V - G/J)/(F/H - Z_V)$$

$$Z_L = (J/H)*(Z_V - Z_{VS})/(Z_{VO} - Z_V)$$

Another impedance standard that is easy to maintain is a stable 50 ohm load. If a constant $Z_{LX}$ is created to mean the impedance "seen" by the analysis section when $Z_L$ is the stable 50 ohm load, a new constant is created and equation (47) becomes:

$$Z_L = Z_{LX} * (Z_V - Z_{VS})/(Z_{VO} - Z_V) \quad (48)$$

Four calibration standards are still needed, but each is easily maintainable. In summary, the four standards are:
(1) Short Circuit Load
(2) Open Circuit Load
(3) Stable 50 ohm Load
(4) Voltage or Current Standard Items (1)–(3) from the list above were addressed earlier, item (4) will be addressed now. At the moment, accurate RF voltage measurement equipment is easier to obtain than accurate RF current measurement equipment. With this in mind, the equations for calculating $V_L$ and $I_L$ (the load voltage and current) are easily created by working with equations (38) and (39) respectively:

$$|V_L| = |(J * V_V - G * V_I)/(F * J - G * H)| \quad (49)$$
$$= |(V_V - (G/J) * V_I)/(F - (G/J) * H)|$$
$$= |(V_V - Z_{VS} * V_I)/(F - Z_{VS} * H)|$$
$$\boxed{|V_L| = |V_I * (Z_V - Z_{VS})/V_C|}$$

$$\boxed{|I_L| = |V_L|/|Z_L|} \quad (50)$$

Where $V_C$ is a voltage calibration coefficient created from voltage measurement standard.

This derivation can be understood by an explanation of the calibration and measurement cycle that will be utilized by the analysis section:

(1) It is established that calibration will only be completed for specified frequencies in the bandwidth of the V/I Probe (otherwise, an infinitely long calibration table would result).

(2) It is established that the V/I Probe will be calibrated at a certain number of frequencies per decade. The remaining gaps in the spectrum can be filled by simple linear interpolation between adjacent, calibrated frequency points.

(3) The 50 Ω load standard is measured (both impedance and phase) at each of the frequencies established in step (2). This load information is made available to the DSP in the analysis section.

(4) A short circuit is connected to the V/I Probe and sufficient power is run though the V/I sensor into the short circuit to create signals strong enough to be measured by the analysis section. The DSP in the analysis section computes the value $Z_V$ by dividing the voltage signal $V_V$ by the current signal $V_I$. This $Z_V$ value is then stored as the $Z_{VS}$ calibration constant for the frequency measured. This is repeated for all frequencies chosen in step (2).

(5) An open circuit is connected to the V/I Probe and sufficient power is run through the V/I sensor into the open circuit to create signals strong enough to be measured by the analysis section. The DSP in the analysis section computes the value $Z_V$. This $Z_V$ value is then stored as the $Z_{VO}$ calibration constant for the frequency measured. This is repeated for all frequencies chosen in step (2).

(6) The 50 Ω load standard is connected to the V/I Probe and sufficient power is run through the V/I sensor into the 50 Ω load to create signals strong enough to be measured by the analysis section. The DSP in the analysis section computes the value $Z_V$. This $Z_V$ value with the data taken in steps (3) to (5) is used to compute the calibration constant $Z_{LX}$ which is stored for the frequency measured. This is repeated for all frequencies chosen in step (2).

(7) A load of any impedance is connected to the V/I Probe for the voltage measurement standard and sufficient power is run through the V/I sensor and voltage measurement standard to create signals strong enough to be measured by each. The DSP in the analysis section computes the value $Z_V$. This $Z_V$ value in addition to the data from the voltage measurement standard is used to compute the calibration constant $V_C$ which is stored for the frequency measured. This is repeated for all frequencies chosen in step (2).

Now, when data are requested from the V/I Probe the DSP simply needs to calculate $Z_V$, extract the stored calibration constants $Z_{VS}$, $Z_{VO}$, $Z_{LX}$, and $V_C$ and use them to calculate $Z_L$, $V_L$, and $I_L$ using equations (48), (49), and (50) respectively. With these three calculations complete, the DSP has all the necessary data (i.e. |V|, |I|, |Z|, and ∠Z) to compute all other items requested by the operator.

One unique point about this calibration method is that its accuracy is based solely upon how accurately the stable 50 Ω load can be measured and how accurate is the voltage standard. To improve accuracy of the calibration all that needs to be done is a more accurate measurement of the 50 Ω load and a more accurate voltage standard.

While the invention has been described in detail with reference to a preferred embodiment, the invention is certainly not limited only to that embodiment, but may be applied in a wide range of environments. Rather, many modifications and variations will present themselves to persons of skill in the art without departing from the scope and spirit of this invention, as defined in the appended claims.

I claim:

1. A voltage and current probe for detecting voltage and current values of an RF power wave that is applied therethrough to an RF load, comprising:

a metal housing having a cylindrical bore therethrough, and first and second recesses, the recesses each opening to said cylindrical bore for an axial distance, and wherein said first and second recesses are positioned opposite one another on said metal housing across the axis of said cylindrical bore;

a center conductor extending along the axis of said cylindrical bore;

a cylindrical insulator within said cylindrical bore surrounding said center conductor and extending radially between said center conductor and said metal housing;

a voltage sensor board mounted in the first recess and having a capacitive pickup plate facing radially towards the axis of said cylindrical bore; and a current sensor board mounted in the second recess and having an elongated inductive pickup conductor facing radially towards the axis of said cylindrical bore and extending axially for said axial distance.

2. The voltage and current probe as in claim 1, wherein said voltage sensor board includes, in order radially outward, said capacitive pickup plate, an insulator layer, a ground plate completion conductive layer, and a circuit board carrying voltage pickup components, with at least one electrical conductor passing from said capacitive pickup plate through openings in said insulator layer and said ground plate completion conductive layer to said voltage pickup components.

3. The voltage and current probe as in claim 2 wherein said voltage pickup components are symmetrically distributed upon said voltage sensor board so as to create an electrical symmetry in both axial and transverse directions.

4. The voltage and current probe as in claim 1, wherein said current sensor board includes, in order radially outward, said inductive pickup conductor, an insulator layer, a ground plate completion conductive layer, and a circuit board carrying current pickup components, with at least one electrical conductor passing from each end of said inductive pickup conductor through openings in said insulator layer and said ground plate completion conductive layer to said current pickup components.

5. The voltage and current probe as in claim 4, wherein said current pickup components are symmetrically distributed on said current sensor board so as to create an electrical symmetry both in axial and transverse directions.

* * * * *